US009123911B2

(12) United States Patent
Kim et al.

(10) Patent No.: US 9,123,911 B2
(45) Date of Patent: Sep. 1, 2015

(54) DISPLAY APPARATUS

(71) Applicant: Samsung Display Co., Ltd., Yongin, Gyeonggi-Do (KR)

(72) Inventors: Nam-Jin Kim, Yongin (KR); Chul-Hwan Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 56 days.

(21) Appl. No.: 14/027,165

(22) Filed: Sep. 14, 2013

(65) Prior Publication Data
US 2014/0319474 A1  Oct. 30, 2014

(30) Foreign Application Priority Data

Apr. 25, 2013  (KR) .................. 10-2013-0046210

(51) Int. Cl.
*H01L 33/00* (2010.01)
*H01L 21/00* (2006.01)
*H01L 51/52* (2006.01)

(52) U.S. Cl.
CPC .................... *H01L 51/5256* (2013.01)

(58) Field of Classification Search
CPC .................................. H01L 51/5256
USPC ................... 257/100, 40, 79, 642; 438/26, 99
See application file for complete search history.

(56) References Cited

U.S. PATENT DOCUMENTS

| 8,169,132 | B2 * | 5/2012 | Oh et al. ....................... 313/489 |
| 8,247,809 | B2 * | 8/2012 | Kim ................................ 257/40 |
| 8,664,852 | B2 * | 3/2014 | Kim et al. ..................... 313/512 |
| 8,674,596 | B2 * | 3/2014 | Kim et al. ..................... 313/504 |
| 2012/0212433 | A1 | 8/2012 | Lee et al. |
| 2013/0334959 | A1 * | 12/2013 | Wang et al. ................... 313/512 |

FOREIGN PATENT DOCUMENTS

| KR | 10-0667569 B1 | 1/2007 |
| KR | 10-2011-0133881 A | 12/2011 |
| KR | 10-2012-0095019 A | 8/2012 |

* cited by examiner

*Primary Examiner* — Calvin Lee
(74) *Attorney, Agent, or Firm* — Robert E. Bushnell, Esq.

(57) ABSTRACT

Provided is a display apparatus that is bendable. The display apparatus includes: a substrate including a display region that includes a plurality of light-emitting devices and an edge region that surrounds the display region; and a thin-film encapsulation layer on the display region and the edge region of the substrate. The thin-film encapsulation layer includes a plurality of inorganic films and at least one organic film disposed between the plurality of the inorganic films. At least one of the plurality of the inorganic films of the thin-film encapsulation layer includes inorganic patterns.

19 Claims, 8 Drawing Sheets

DISPLAY APPARATUS

CLAIM OF PRIORITY

This application claims the benefit of Korean Patent Application No. 10-2013-0046210, filed on Apr. 25, 2013, in the Korean Intellectual Property Office, the disclosure of which is incorporated herein in its entirety by reference.

BACKGROUND OF THE INVENTION

1. Field of the Invention

The present invention relates to a display apparatus, and more particularly, to a display apparatus having a bendable edge region.

2. Description of the Related Art

Recently, display apparatuses have emerged as important electronic products. Display apparatuses are being miniaturized for convenient portability. However, this miniaturization of display apparatuses is unable to satisfy all requirements of various consumers. Accordingly, display apparatuses including flexible panels are being actively researched and developed.

A flexible panel may be manufactured by forming display devices on a flexible substrate, and then forming a thin-film encapsulation layer for protecting the display devices from external moisture or oxygen. The thin-film encapsulation layer is generally formed by alternately stacking an organic film and an inorganic film. Here, when the flexible panel is bent, the inorganic film in the thin-film encapsulation layer may crack due to a stress. Accordingly, display apparatuses need to have a structure for relieving the stress applied to the inorganic films therein when being bent.

SUMMARY OF THE INVENTION

The present invention provides a display apparatus having a bendable edge region.

According to an aspect of the present invention, there is provided a display apparatus including: a substrate including a display region that includes a plurality of light-emitting devices, and an edge region that surrounds the display region; and a thin-film encapsulation layer disposed on the display region and the edge region of the substrate. The thin-film encapsulation layer includes a plurality of inorganic films and at least one organic film disposed between the plurality of the inorganic films. At least one of the plurality of the inorganic films includes inorganic patterns.

The inorganic patterns may be spaced apart from each other.

A portion of the display apparatus, on which the inorganic patterns are disposed, may be bendable.

The inorganic patterns may be located on the edge region.

The inorganic patterns may be partially formed on a portion of the edge region, and the display region may be disposed between the portions of the edge regions.

The inorganic patterns may be arranged in line patterns extending in a first direction and spaced apart from each other in a second direction perpendicular to the first direction, and the display region is disposed between the portions of the edge regions in the second direction.

The substrate may extend in first and second directions that are perpendicular to each other. The inorganic patterns may include first inorganic patterns between which the display region is disposed in the first direction, and second inorganic patterns between which the display region is disposed in the second direction. The first inorganic patterns may be arranged in line patterns extending in the second direction and spaced apart from each other in the first direction, and the second inorganic patterns may be arranged in line patterns extending in the first direction and spaced apart from each other in the second direction.

The inorganic patterns may be arranged in tile patterns.

The display apparatus may further include an organic material filing a space formed between the inorganic patterns spaced apart from each other.

The organic material is the same as a material of the at least one organic film.

The organic material may be different from a material of the at least one organic film.

The plurality of light-emitting devices may be organic light-emitting devices.

The substrate may be a flexible substrate.

According to another aspect of the present invention, there is provided a display apparatus including: a substrate including a display region and an edge region; a plurality of light-emitting devices formed on the display region of the substrate; a lower inorganic film disposed on the display region and the edge region to cover the plurality of light-emitting devices; an organic film disposed on the lower inorganic film to cover the display region; and an upper inorganic film disposed on the lower inorganic film and the organic film to cover the organic film, wherein at least one of the lower inorganic film and the upper inorganic film includes inorganic patterns formed on the edge region.

The inorganic patterns may be spaced apart from each other to expose a portion of the edge region, and include lower inorganic patterns and upper inorganic patterns corresponding to the lower inorganic patterns, and the lower inorganic film may include the lower inorganic patterns and the upper inorganic film may include the upper inorganic patterns.

The display apparatus may further include an organic material filling a gap between the inorganic patterns and extending to the portion of the edge region.

The lower inorganic film may continuously extend to cover the edge region, and the upper inorganic film may include the inorganic patterns spaced apart from each other to expose a portion of the lower inorganic film.

The display apparatus may further include an organic material filling a gap between the inorganic patterns and extending to the exposed portion of the lower inorganic film.

The lower inorganic film may include the inorganic patterns spaced apart from each other to expose a portion of the edge region, and the organic film may fill a gap between the inorganic patterns and extend to the portion of the edge region.

The lower inorganic film may include the inorganic patterns spaced apart from each other to expose a portion of the edge region, the display apparatus may further include an organic material filling a gap between the inorganic patterns and extending to the portion of the lower inorganic film, and the upper inorganic film may continuously extend to cover the inorganic patterns and the organic material.

The edge region may be bendable.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
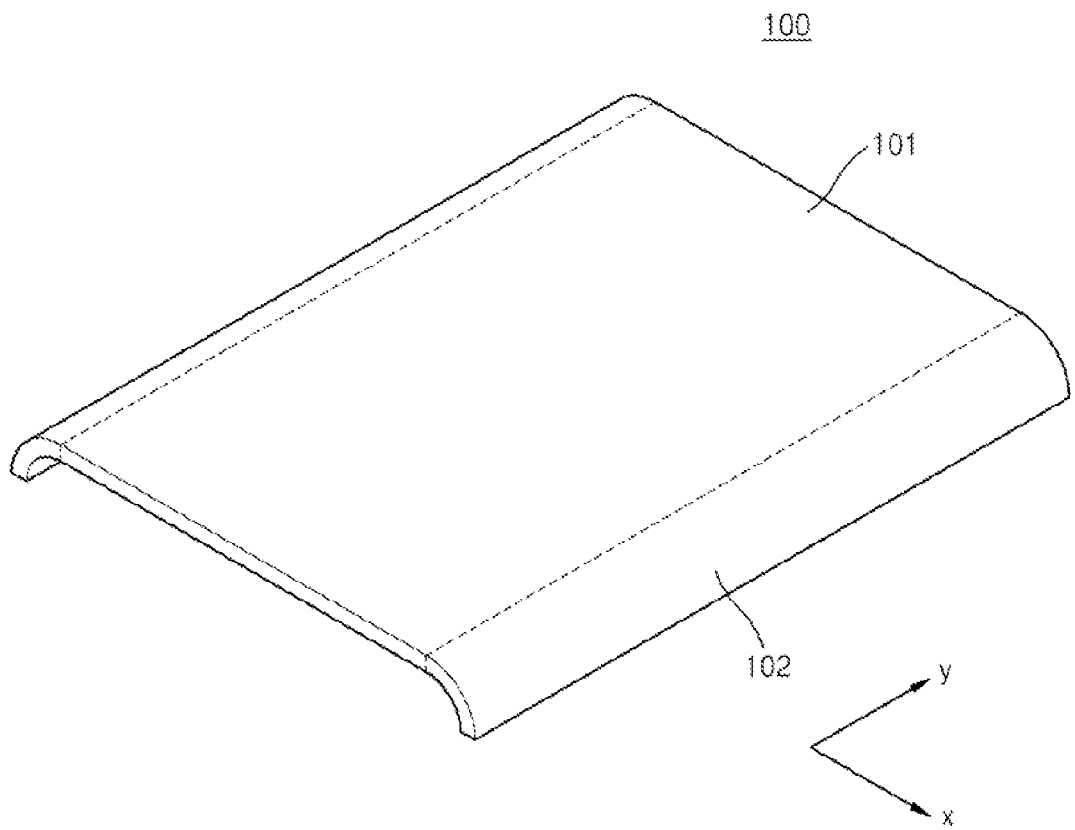
FIG. 1 is a schematic perspective view of a display apparatus according to an embodiment of the present invention.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those of ordinary skill in the art.

In the drawings, like reference numerals denote like elements, and the sizes and thicknesses of layers and regions may be exaggerated or downscaled for clarity.

The terms used herein are for the purpose of describing particular embodiments only and are not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. While such terms as "first," "second," etc., may be used to describe various components, such components must not be limited to the above terms. The above terms are used only to distinguish one component from another. Hereinafter, when a first feature is connected, is combined, or contacts a second feature, a third feature may be disposed between the first and second features. Also, when a first component is disposed on a second component, a third component may be disposed between the first and second components. However, if it is described that the first component is directly disposed on the second component, then the third component is not disposed between the first and second components.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 100 according to an embodiment of the present invention. Referring to FIG. 1, the display apparatus 100 includes a display region 101 that is flat and an edge region 102 that is bent.

The display region 101 may have an array of pixels, wherein the pixels may each include a thin-film transistor (TFT) and a light-emitting device controlled by the TFT. The light-emitting device may be an organic light-emitting device (OLED) that emits light by itself. The display region 101 may be referred to as a light-emitting region.

Alternatively, the pixels may each include a TFT and a liquid crystal layer controlled by the TFT, and a backlight may be disposed to overlap the display region 101. The display region 101 may be referred to as an active region.

As shown in FIG. 1, the display region 101 may be flat. Alternatively, the display region 101 may be flexible. For example, the display region 101 may bend in a first direction, i.e., an x-axis direction, or in a second direction, i.e., a y-axis direction. The display region 101 may bend in any direction.

The edge region 102 may be disposed on both sides of the display region 101 in the first direction. Although not shown in FIG. 1, the edge region 102 may also be disposed on both sides of the display region 101 in the second direction.

The edge region 102 may include driving circuits or wires for driving the light-emitting devices of the display region 101. The edge region 102 is a region where an image is not displayed, and thus may be referred to as a dead space region.

As shown in FIG. 1, the edge region 102 may bend in the first direction. The edge region 102 may bend in an angle equal to or larger than 90°. Moreover, the edge region 102 may become flat according to an external force. Also, the edge region 102 may bend in the second direction.

As the edge region 102 bends, a stress is applied to an inorganic film disposed in the edge region 102, and thus the inorganic film may break due to the stress. In other words, the inorganic film may be cracked. According to an embodiment of the present invention, the inorganic film may have inorganic patterns that are spaced apart from each other so as to decrease the stress that causes the crack.

Figure 2:
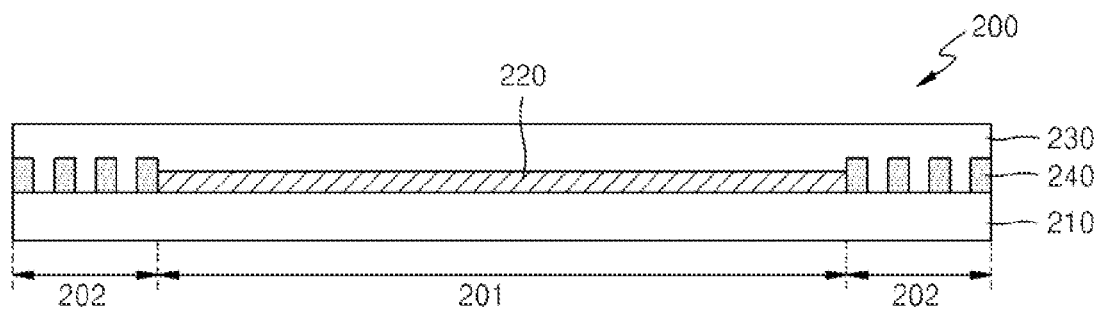
FIG. 2 is a schematic cross-sectional view of a display apparatus according to an embodiment of the present invention.

FIG. 2 is a schematic cross-sectional view of a display apparatus 200 according to an embodiment of the present invention. Referring to FIG. 2, the display apparatus 200 is bendable. Although the display apparatus 200 is shown to be flat, the display apparatus 200 may bend. Specifically, the display apparatus 200 may largely bend at a location where inorganic patterns 240 are disposed.

The display apparatus 200 includes a substrate 210, a device layer 220 disposed on the substrate 210, and a thin-film encapsulation layer 230 covering the substrate 210 and the device layer 220. The thin-film encapsulation layer 230 includes the inorganic patterns 240.

The substrate 210 may include a display region 201 where the device layer 220 is formed, and an edge region 202 where the inorganic patterns 240 are disposed. The inorganic patterns 240 may be partially formed on a portion of the edge region.

The substrate 210 may be a flexible substrate. For example, the substrate 210 may be formed of plastic having excellent thermal resistance and durability, such as polyimide (PI), polyethylene terephthalate (PET), polyethylene naphtalate (PEN), polycarbonate (PC), polyarylate (PAR), polyetherimide (PEI), and polyethersulphone (PES). However, a material of the substrate 210 is not limited thereto, and any material having a flexible characteristic, such as a metal foil or thin glass, may be used to form the substrate 210.

The device layer 220 may be disposed on the display region 201 of the substrate 210. The device layer 220 may include TFTs and light-emitting devices connected to the TFTs. The device layer 220 may include a pixel array.

The thin-film encapsulation layer 230 may encapsulate the device layer 220 in order to prevent external moisture or oxygen from penetrating into the device layer 220. The thin-film encapsulation layer 230 may be disposed on the substrate 210 to cover the device layer 220.

The thin-film encapsulation layer 230 may include a plurality of inorganic films and at least one organic film disposed between the plurality of the inorganic films. In other words, the thin-film encapsulation layer 230 may be formed by alternately stacking inorganic films and organic films on the substrate 210 to cover the device layer 220.

At least one of the inorganic films of the thin-film encapsulation layer 230 may include the inorganic patterns 240. For example, when the thin-film encapsulation layer 230 has a stacked structure of a first inorganic film, a first organic film, a second inorganic film, a second organic film, and a third inorganic film on the substrate 210, the first inorganic film may include the inorganic patterns 240. In other words, the inorganic patterns 240 may be formed by patterning the first inorganic film. Alternatively, the second or third inorganic film may include the inorganic patterns 240. Alternatively, a combination of the first and second inorganic films or a combination of the second and third inorganic films may include the inorganic patterns 240. Alternatively, a combination of the first through third inorganic films may include the inorganic patterns 240.

The inorganic films included in the thin-film encapsulation layer 230 may be a single or stacked film including a metal oxide or a metal nitride. In detail, the inorganic films may include any one of $SiN_x$, $Al_2O_3$, $SiO_2$, and $TiO_2$.

The organic films included in the thin-film encapsulation layer 230 may be formed of a polymer, and may be a single or stacked film formed of any one of PET, PI, PC, epoxy, polyethylene, and polyacrylate. For example, the organic films may be formed of polyacrylate. In detail, the organic films may include a polymerized monomer composition including diacrylate-based monomer and triacrylate-based monomer. The polymerized monomer composition may further include a monoacrylate-based monomer. Alternatively, the polymerized monomer composition may further include a photoinitiator, such as TPO.

The inorganic patterns 240 may be disposed on the edge region 202 of the substrate 210, or spaced apart from each other on a same plane as shown in FIG. 2. A gap between the inorganic patterns 240, which are spaced apart from each other, may be filled with an organic material. The organic material filling the gap may be the same as a material of the organic film included in the thin-film encapsulation layer 230. Alternatively, the organic material may be different from the material of the organic film included in the thin-film encapsulation layer 230. The organic material may be a flexible material, and the material of the organic film included in the thin-film encapsulation layer 230 may have high strength and high sealability.

The organic material may absorb a stress applied to the inorganic patterns 240 when the display apparatus 200 bends. Accordingly, even when the edge region 202 is largely bent, the inorganic patterns 240 may not crack. Alternatively, the gap between the inorganic patterns 240 may be an air gap.

Figure 3:
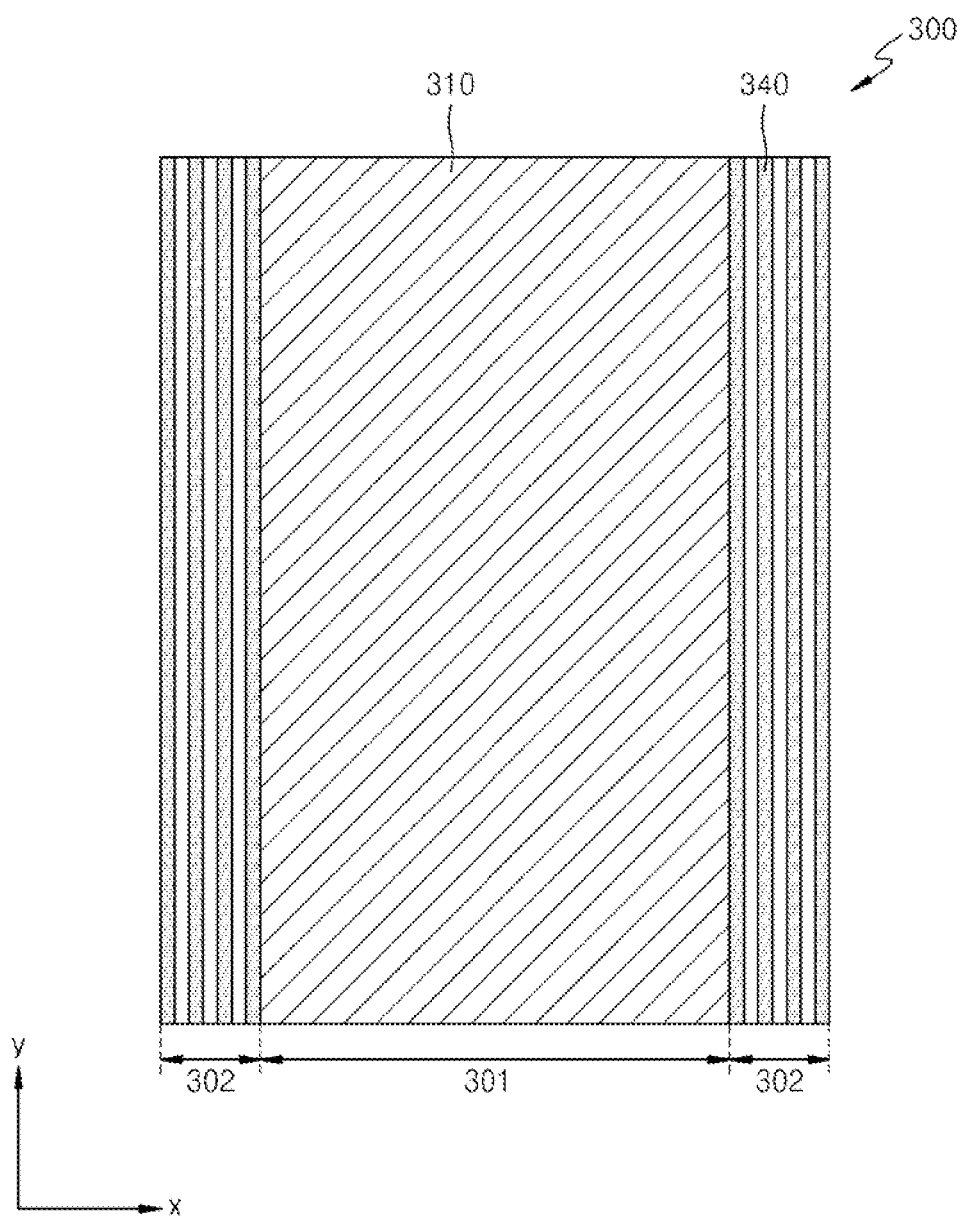
FIG. 3 is a schematic plan view of a display apparatus according to an embodiment of the present invention.

FIG. 3 is a schematic plan view of a display apparatus 300 according to an embodiment of the present invention. Referring to FIG. 3, the display apparatus 300 is bendable. Although the display apparatus 300 is shown to be flat in FIG. 3, the display apparatus 300 may bend. Specifically, the display apparatus 300 may largely bend in an edge region 302 where inorganic patterns 340 are disposed.

The display apparatus 300 includes a substrate 310 that includes a display region 301 and the edge region 302, and the inorganic patterns 340 disposed on the edge region 302. The substrate 310 may extend in a first direction, i.e., an x-axis direction, and a second direction, i.e., a y-axis direction. The substrate 310 may be a flexible substrate.

Light-emitting devices may be formed in the display region 301. The display region 301 may be flat. Alternatively, the display region 301 may be also bendable.

The edge region 302 may be disposed on both sides of the display region 301 in the first direction. Although not shown in FIG. 3, the edge region 302 may also be disposed on both sides of the display region 301 in the second direction. The inorganic patterns 340 may be disposed in the edge region 302, and the edge region 302 may bend based on an axis extending in the second direction.

As shown in FIG. 3, the inorganic patterns 340 may have line patterns that are spaced apart from each other in the first direction and extending in the second direction. In FIG. 3, a thickness of the inorganic patterns 340 is similar to a width of a gap between the inorganic patterns 340, but alternatively, the thickness of the inorganic patterns 340 may be larger than the width of the gap. Alternatively, the thickness of the inorganic patterns 340 may be smaller than the width of the gap. The gap between the inorganic patterns 340 may be filled by an organic material.

Alternatively, the inorganic patterns 340 may have tile patterns in which patterns of certain shapes are regularly arranged.

Figure 4:
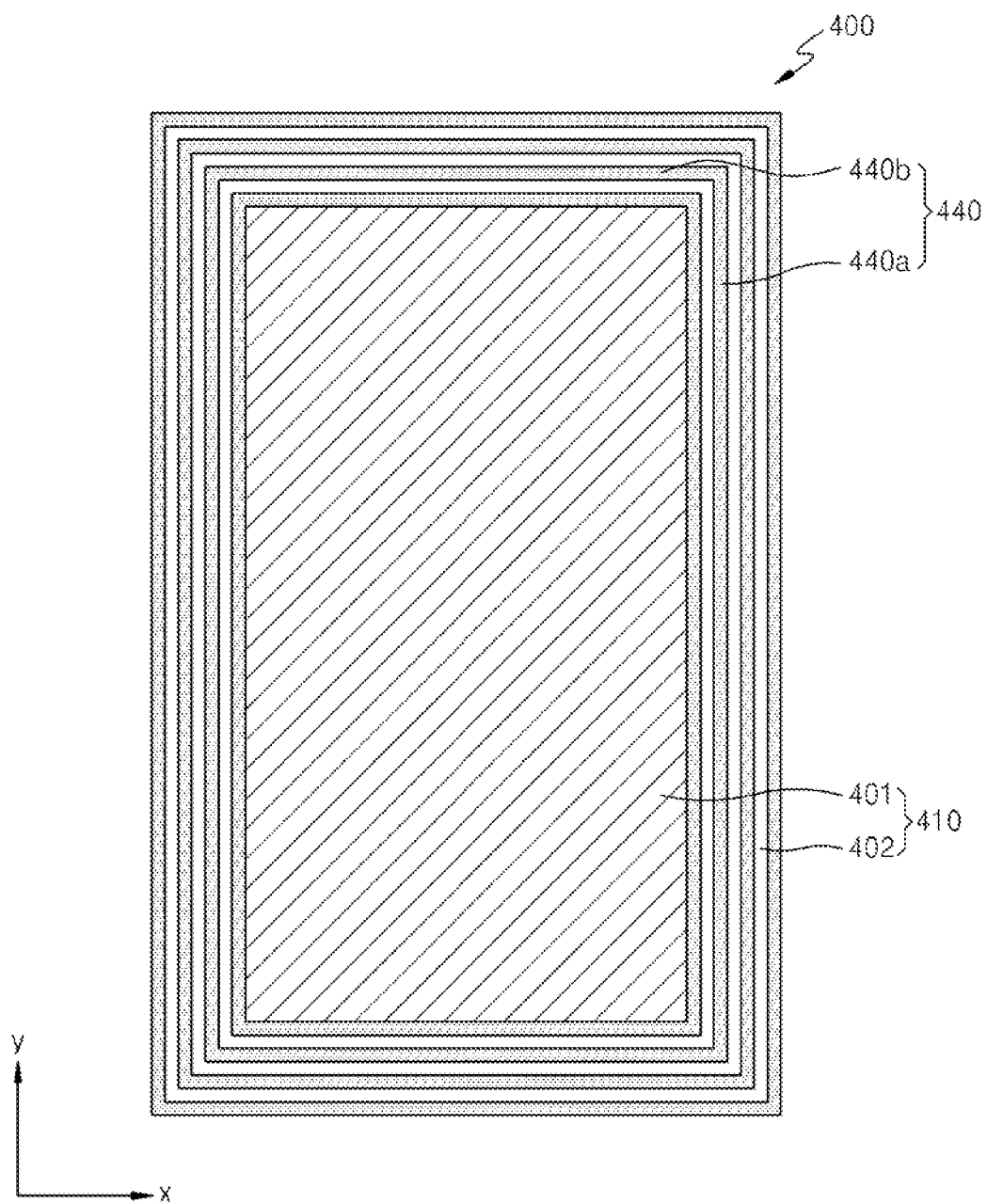
FIG. 4 is a schematic plan view of a display apparatus according to another embodiment of the present invention.

FIG. 4 is a schematic plan view of a display apparatus 400 according to another embodiment of the present invention. Referring to FIG. 4, the display apparatus 400 is bendable. Although the display apparatus 400 is shown to be flat in FIG. 4, the display apparatus 400 may bend. Specifically, the display apparatus 400 may largely bend in an edge region 402 where inorganic patterns 440 are disposed.

The display apparatus 400 includes a substrate 410 that includes a display region 401 and the edge region 402 that surrounds the display region 401, and the inorganic patterns 440 disposed on the edge region 402. Light-emitting devices may be formed in the display region 401.

The edge region 402 may be disposed to surround the display region 401. The inorganic patterns 440 may be disposed in the edge region 402.

In detail, first inorganic patterns 440a may be disposed in a first portion of the edge region 402 at both sides of the display region 401 in a first direction, i.e., an x-axis direction, wherein the first inorganic patterns 440a may have line patterns that are spaced apart from each other in the first direction and extend in a second direction, i.e., a y-axis direction. The first portion of the edge region 402 may bend based on an axis extending in the second direction.

Second inorganic patterns 440b may be disposed in a second portion of the edge region 402 at both sides of the display region 401 in the second direction, wherein the second inorganic patterns 440b may have line patterns that are spaced apart from each other in the second direction and extend in the first direction. The second portion of the edge region 402 may bend based on an axis extending in the first direction.

Figure 5:
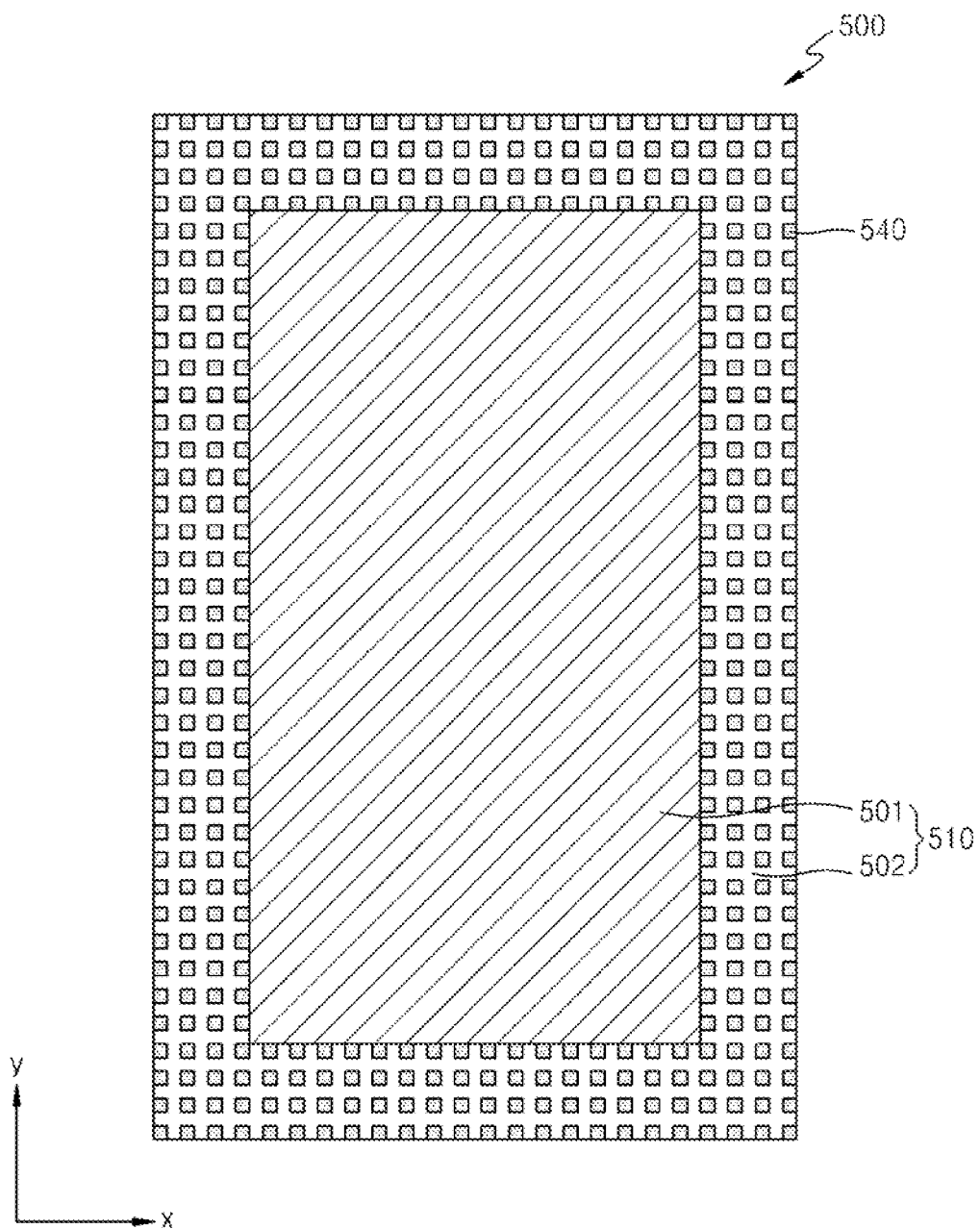
FIG. 5 is a schematic plan view of a display apparatus according to another embodiment of the present invention.

FIG. 5 is a schematic plan view of a display apparatus 500 according to another embodiment of the present invention. Referring to FIG. 5, the display apparatus 500 is bendable. Although the display apparatus 500 is shown to be flat in FIG. 5, the display apparatus 500 may bend.

The display apparatus 500 includes a substrate 510 having a display region 501 and an edge region 502 surrounding the display region 501, and inorganic patterns 540 disposed in the edge region 502. Light-emitting devices may be formed in the display region 501.

The inorganic patterns 540 may be disposed in the edge region 502. The inorganic patterns 540 may be arranged in tile patterns in which patterns of certain shapes are regularly arranged. In FIG. 5, the inorganic patterns 540 are arranged in tile patterns in which square patterns are regularly arranged, but alternatively, rectangular patterns may be regularly arranged.

Figure 6:
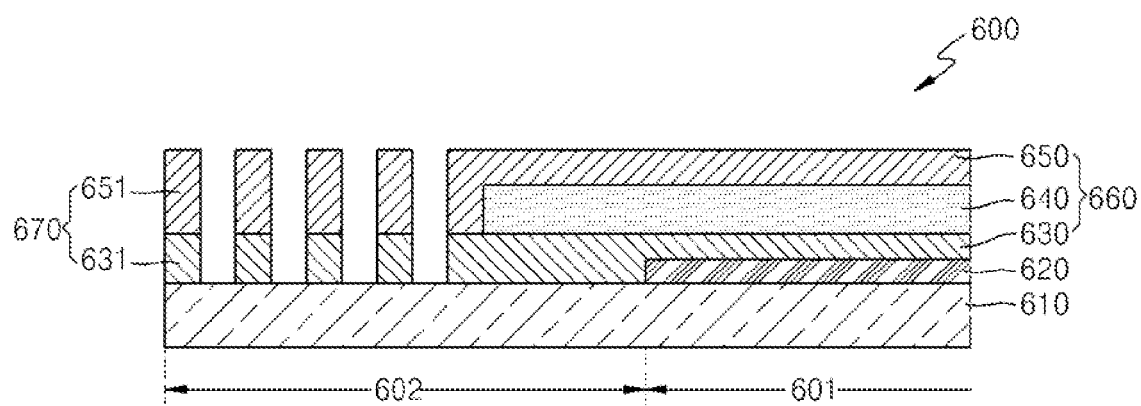
FIG. 6 is a schematic cross-sectional view of a portion of a display apparatus, according to an embodiment of the present invention.

FIG. 6 is a schematic cross-sectional view of a portion of a display apparatus 600, according to an embodiment of the present invention. Referring to FIG. 6, the display apparatus 600 is bendable. Although the display apparatus 600 is shown to be flat in FIG. 6, the display apparatus 600 may bend.

The display apparatus 600 includes a substrate 610, a device layer 620 disposed on the substrate 610, and a thin-film encapsulation layer 660 covering the substrate 610 and the device layer 620. The thin-film encapsulation layer 660 includes inorganic patterns 670.

The substrate 610 may include a display region 601 in which the device layer 620 is formed, and an edge region 602 in which the inorganic patterns 670 are disposed.

The device layer 620 may include TFTs and light-emitting devices connected to the TFTs, and may include a pixel array.

The thin-film encapsulation layer 660 may encapsulate the device layer 620 so that external moisture and oxygen do not penetrate into the device layer 620. The thin-film encapsulation layer 660 may include a plurality of inorganic films and at least one organic film disposed between the inorganic films. In FIG. 6, the thin-film encapsulation layer 660 includes a lower inorganic film 630, an organic film 640, and an upper inorganic film 650, but alternatively, the thin-film encapsulation layer 660 may include more numbers of organic films and inorganic films. Also, an uppermost layer of the thin-film encapsulation layer 660, which is externally exposed, is an inorganic film in FIG. 6, but may alternatively be an organic film.

The lower inorganic film 630 may be disposed to completely cover the device layer 620 disposed on the substrate 610. The lower inorganic film 630 may include lower inorganic patterns 631 formed on the edge region 602. The lower inorganic film 630 may be a single or stacked film including a metal oxide or a metal nitride, and may include any one of $SiN_x$, $Al_2O_3$, $SiO_2$, and $TiO_2$.

Although not shown in FIG. 6, a halogenated metal layer including lithium fluoride (LiF) may be disposed between the device layer 620 and the lower inorganic film 630. The halogenated metal layer may prevent the device layer 620 from being damaged when the lower inorganic film 630 is formed via a sputtering method or a plasma deposition method.

The organic film 640 may be disposed on the lower inorganic film 630 to cover the device layer 620. As shown in FIG. 6, the organic film 640 may be disposed on a portion of the lower inorganic film 630. The organic film 640 may be disposed to completely cover the display region 601, and may be disposed to cover a portion of the edge region 602. The organic film 640 may be formed of a polymer, and may be a single or stacked film including any one of PET, PI, PC, epoxy, polyethylene, and polyacrylate. For example, the organic film 640 may be formed of polyacrylate, and in detail, may include a polymerized monomer composition including a diacrylate-based monomer and a triacrylate-based monomer.

The upper inorganic film 650 may be disposed to completely cover the organic film 640. The upper inorganic film 650 may include upper inorganic patterns 651 formed on the edge region 602. The upper inorganic film 650 may be a single or stacked film including a metal oxide or a metal nitride, and may include any one of $SiN_x$, $Al_2O_3$, $SiO_2$, and $TiO_2$. The upper inorganic film 650 and the lower inorganic film 630 may be formed of a same inorganic material. Alternatively, the upper inorganic film 650 and the lower inorganic film 630 may be formed of different inorganic materials.

The thin-film encapsulation layer 660 may include the inorganic patterns 670, wherein the inorganic patterns 670 may include the lower inorganic patterns 631 and the upper inorganic patterns 651. The inorganic patterns 670 may be formed by patterning portions on the edge region 602 where the lower and upper inorganic films 630 and 650 are directly stacked to expose the substrate 610.

A portion of the edge region 602 of the substrate 610 may be exposed by a gap between the inorganic patterns 670, and the gap may be an air gap.

Figure 7:
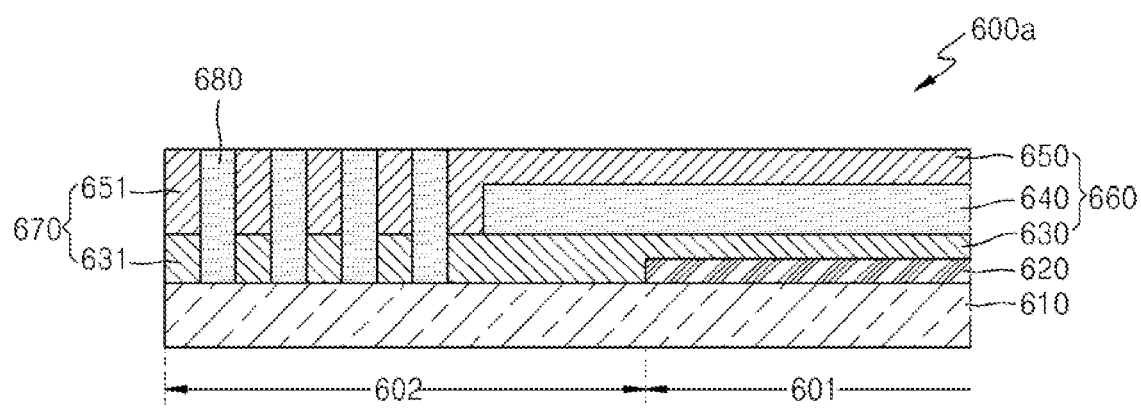
FIG. 7 is a schematic cross-sectional view of a portion of a display apparatus, according to another embodiment of the present invention.

FIG. 7 is a schematic cross-sectional view of a portion of a display apparatus 600a, according to another embodiment of the present invention. FIG. 7 shows the display apparatus 600a that is modified from the display apparatus 600 of FIG. 6. Thus, details about the display apparatus 600 may also be applied to details about the display apparatus 600a.

The display apparatus 600a may further include an organic material 680 filled in the gap between the inorganic patterns 670. The organic material 680 may extend to a top surface of the substrate 610. The organic material 680 may be formed of a same material as the organic film 640. Alternatively, the organic material 680 may be formed of a different material from the organic film 640.

Figure 8:
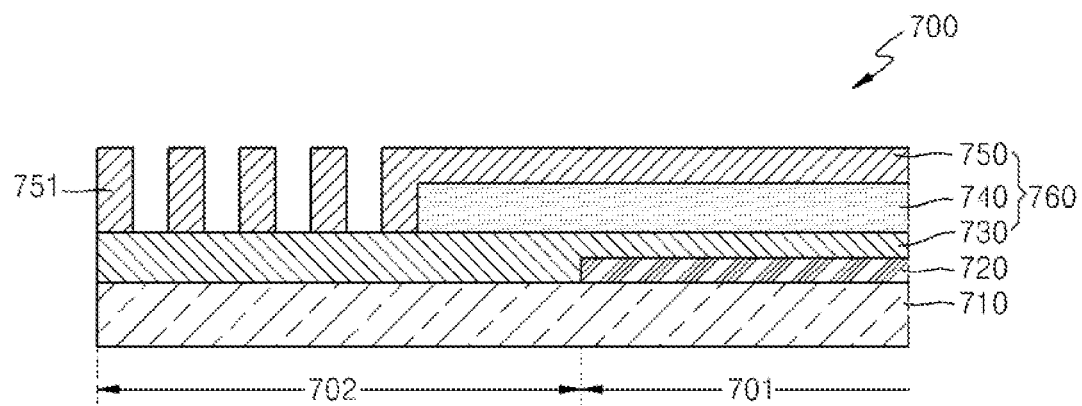
FIG. 8 is a schematic cross-sectional view of a portion of a display apparatus, according to another embodiment of the present invention.

FIG. 8 is a schematic cross-sectional view of a portion of a display apparatus 700, according to another embodiment of the present invention. Referring to FIG. 8, the display apparatus 700 is bendable. Although the display apparatus 700 is shown to be flat in FIG. 8, the display apparatus 700 may bend.

The display apparatus 700 includes a substrate 710, a device layer 720 disposed on the substrate 710, and a thin-film encapsulation layer 760 covering the substrate 710 and the device layer 720. The thin-film encapsulation layer 760 includes inorganic patterns 751.

The substrate 710 may include a display region 701 in which the device layer 720 is formed, and an edge region 702 in which the inorganic patterns 751 are disposed.

The thin-film encapsulation layer 760 is similar to the thin-film encapsulation layer 660 of FIG. 6, and thus details about the thin-film encapsulation layer 660 may be applied to details about the thin-film encapsulation layer 760. Only elements of the thin-film encapsulation layer 760 that are different from the thin-film encapsulation layer 660 will now be described.

As shown in FIG. 8, the thin-film encapsulation layer 760 may include a lower inorganic film 730, an organic film 740, and an upper inorganic film 750. The lower inorganic film 730 may not only cover the device layer 720 formed on the substrate 710, but may also completely cover the substrate 710 including the edge region 702 of the substrate 710. The lower inorganic film 730 may be a continuous layer that is not patterned.

The organic film 740 may be disposed on a portion of the lower inorganic film 730 to cover the device layer 720. The organic film 740 may be disposed to completely cover the display region 701 and partially cover the edge region 702.

The upper inorganic film 750 may be disposed to completely cover the organic film 740. The upper inorganic film 750 may include the inorganic patterns 751 on the edge region 702. The inorganic patterns 751 may be formed by patterning the upper inorganic film 750 on the edge region 702 to expose the lower inorganic film 730.

A portion of the lower inorganic film 730 on the edge region 702 may be exposed by a gap between the inorganic patterns 751, and the gap may be an air gap.

Figure 9:
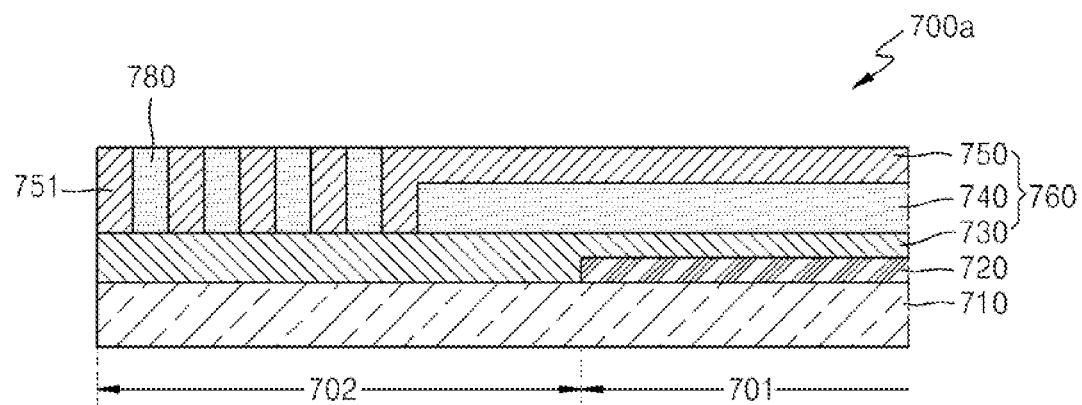
FIG. 9 is a schematic cross-sectional view of a portion of a display apparatus, according to another embodiment of the present invention.

FIG. 9 is a schematic cross-sectional view of a portion of a display apparatus 700*a*, according to another embodiment of the present invention. FIG. 9 shows the display apparatus 700*a* that is modified from the display apparatus 700 of FIG. 8. Thus, details about the display apparatus 700 may also be applied to details about the display apparatus 700*a*.

The display apparatus 700*a* may further include an organic material 780 filled in the gap between the inorganic patterns 751. The organic material 780 may extend to a top surface of the lower inorganic film 730. The organic material 780 may be formed of a same material as the organic film 740. Alternatively, the organic material 780 may be formed of a different material from the organic film 740.

Figure 10:
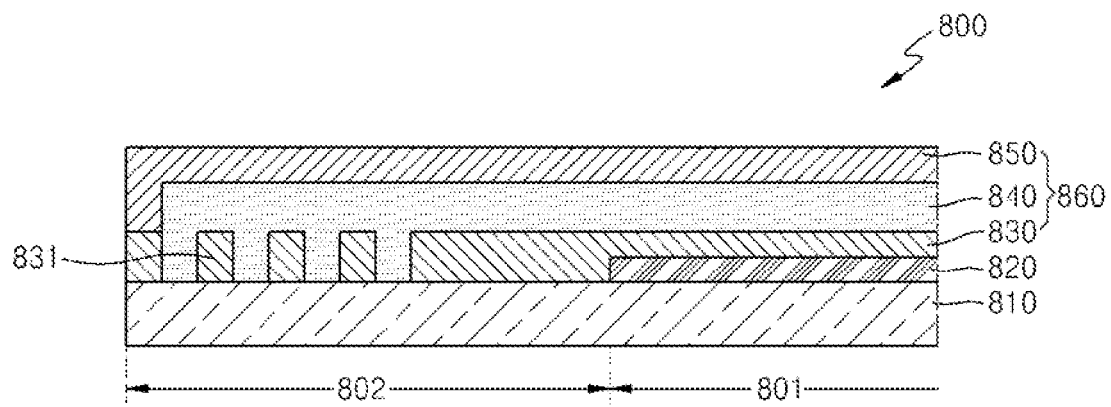
FIG. 10 is a schematic cross-sectional view of a portion of a display apparatus, according to another embodiment of the present invention.

FIG. 10 is a schematic cross-sectional view of a portion of a display apparatus 800, according to another embodiment of the present invention. Referring to FIG. 10, the display apparatus 800 is bendable. Although the display apparatus 800 is shown to be flat in FIG. 10, the display apparatus 800 may bend.

The display apparatus 800 includes a substrate 810, a device layer 820 disposed on the substrate 810, and a thin-film encapsulation layer 860 covering the substrate 810 and the device layer 820. The thin-film encapsulation layer 860 includes inorganic patterns 831.

The substrate 810 may include a display region 801 in which the device layer 820 is formed, and an edge region 802 in which the inorganic patterns 831 are disposed.

The thin-film encapsulation layer 860 is similar to the thin-film encapsulation layer 660 of FIG. 6, and thus details about the thin-film encapsulation layer 660 may be applied to details about the thin-film encapsulation layer 860. Only elements of the thin-film encapsulation layer 860 that are different from the thin-film encapsulation layer 660 will now be described.

As shown in FIG. 10, the thin-film encapsulation layer 860 may include a lower inorganic film 830, an organic film 840, and an upper inorganic film 850.

The lower inorganic film 830 may be disposed to completely cover the device layer 820 on the substrate 810. The lower inorganic film 830 may include the inorganic patterns 831 formed on the edge region 802. The inorganic patterns 831 may be formed by patterning the lower inorganic film 830 to expose a portion of the edge region 802.

The organic film 840 may be disposed on a portion of the lower inorganic film 830 to cover the device layer 820. A gap between the inorganic patterns 831 may be filled with the organic film 840. The organic film 840 may extend to a top surface of the substrate 810. The organic film 840 may completely cover the display region 701 and to cover the inorganic patterns 831 on the edge region 802.

The upper inorganic film 850 may completely cover the organic film 840.

Figure 11:
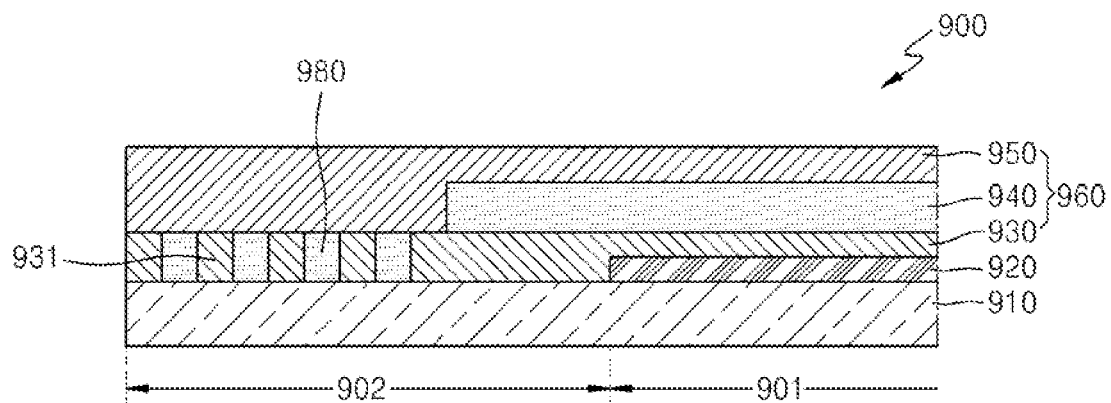
FIG. 11 is a schematic cross-sectional view of a portion of a display apparatus, according to another embodiment of the present invention.

FIG. 11 is a schematic cross-sectional view of a portion of a display apparatus 900, according to another embodiment of the present invention. Referring to FIG. 11, the display apparatus 900 is bendable. Although the display apparatus 900 is shown to be flat in FIG. 11, the display apparatus 900 may bend.

The display apparatus 900 includes a substrate 910, a device layer 920 on the substrate 910, and a thin-film encapsulation layer 960 covering the substrate 910 and the device layer 920. The thin-film encapsulation layer 960 includes inorganic patterns 931.

The substrate 910 may include a display region 901 in which the device layer 920 is formed, and an edge region 902 in which the inorganic patterns 931 are disposed.

The thin-film encapsulation layer 960 is similar to the thin-film encapsulation layer 660 of FIG. 6, and thus details about the thin-film encapsulation layer 660 may be applied to details about the thin-film encapsulation layer 960. Only elements of the thin-film encapsulation layer 960 that are different from the thin-film encapsulation layer 660 will now be described.

As shown in FIG. 11, the thin-film encapsulation layer 960 may include a lower inorganic film 930, an organic film 940, and an upper inorganic film 950.

The lower inorganic film 930 may completely cover the device layer 920 on the substrate 910. The lower inorganic film 930 may include the inorganic patterns 931 on the edge region 902. The inorganic patterns 931 may be formed by patterning the lower inorganic film 930 to expose a portion of the edge region 902.

A gap between the inorganic patterns 931 may be filled by an organic material 980. The organic material 980 may extend to a top surface of the substrate 910 and have a top surface on a same level as a top surface of the inorganic patterns 931.

The organic film 940 may be disposed on a portion of the lower inorganic film 930 to cover the device layer 920. The organic film 940 may completely cover the display region 901 and partially cover the edge region 902. As shown in FIG. 11, the organic film 940 may not cover the organic material 980. Alternatively, the organic film 940 may cover at least a portion of the organic material 980.

The organic film 940 may be formed of a same material as the organic material 980. Alternatively, the organic film 940 may be formed of a different material from the organic material 980.

The upper inorganic film 950 may be disposed to completely cover the organic film 940. Also, the upper inorganic film 950 may completely cover the organic material 980 filled in the gap between the inorganic patterns 931.

Figure 12:
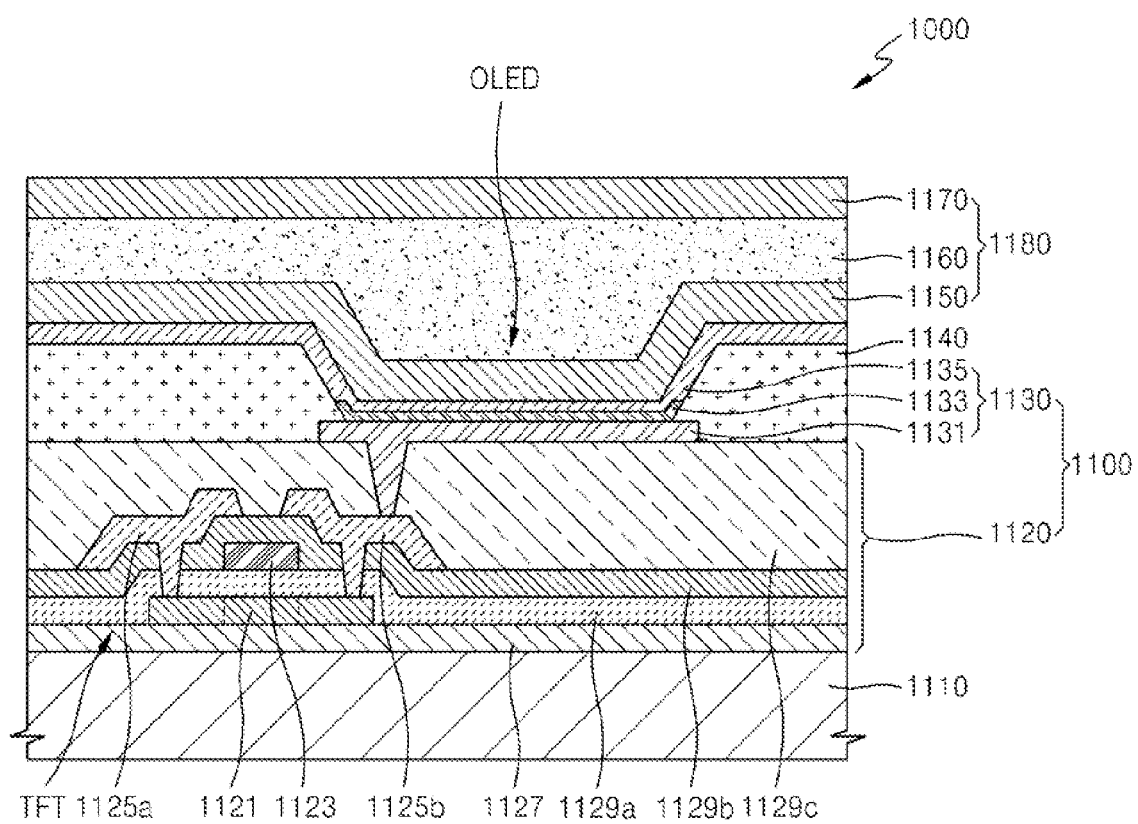
FIG. 12 is a cross-sectional view of a display region of a display apparatus, according to an embodiment of the present invention.

FIG. 12 is a cross-sectional view of a display region of a display apparatus 1000, according to an embodiment of the present invention. In FIG. 12, the display apparatus 1000 may be an organic light-emitting display apparatus.

The display apparatus 1000 includes a substrate 1110, a device layer 1100 on the substrate 1110, and a thin-film encapsulation layer 1180 on the device layer 1100. The device layer 1100 includes an OLED layer 1130. The thin-film encapsulation layer 1180 may include a lower inorganic film 1150, an organic film 1160, and an upper inorganic film 1170, which are sequentially stacked on the substrate 1110.

The substrate 1110 may be a flexible substrate. The device layer 1100 may be disposed on the substrate 1110. Herein, the term device layer 1100 is used to refer to a layer including an OLED and a TFT for driving the OLED.

The device layer 1100 includes a plurality of pixels arranged in a matrix form. Each pixel includes an OLED and an electronic device electrically connected to the OLED. The electronic device may include at least two TFTs including a driving TFT and a switching TFT, and a storage capacitor. The electronic device may be electrically connected to wires, and may be driven by receiving an electric signal from a driving circuit outside the device layer 1100. As such, an arrangement of the electronic device electrically connected to the OLED, and the wires is referred to as a TFT array.

The device layer 1100 includes a device/wire layer 1120 including the TFT array, and the OLED layer 1130 including an OLED array.

The device/wire layer 1120 may include a driving TFT for driving the OLED, a switching TFT, a capacitor, and wires connected to the driving and switching TFTs or the capacitor.

A buffer layer 1127 may be disposed on a top surface of the substrate 1110 to planarize the substrate 1110 and prevent impurities from penetrating into the substrate 1110. The buffer layer 1127 may be formed of an inorganic insulating material.

An active layer 1121 may be disposed in a predetermined region on the buffer layer 1127. The active layer 1121 may be formed by forming an inorganic or organic semiconductor, such as silicon or oxide semiconductor, on an entire surface of the substrate 1110 on the buffer layer 1127, and then patterning the inorganic or organic semiconductor via a photolithography or etching process. When the active layer 1121 is formed of silicon, an amorphous silicon layer may be formed on the entire surface of the substrate 1110, a polycrystalline silicon layer may be formed by crystallizing the amorphous silicon layer, and the polycrystalline silicon layer may be patterned and then impurities may be doped on adjacent regions to form the active layer 1121 including a source region, a drain region, and a channel region between the source and drain regions.

A gate insulating film 1129*a* is disposed on the active layer 1121. A gate electrode 1123 may be disposed in a predetermined region on the gate insulating film 1129*a*. The gate electrode 1123 may be connected to a gate line (not shown) to which a control signal for controlling the TFT is applied. An interlayer insulating film 1129*b* may be disposed on the gate electrode 1123. The interlayer insulating film 1129*b* includes a contact hole exposing the source and drain regions of the active layer 1121, and a source electrode 1125*a* and a drain electrode 1125*b* may be respectively electrically connected to the source and drain regions of the active layer 1121 through the contact hole of the interlayer insulating film 1129*b*. The TFT may be covered and protected by a passivation film 1129*c*. The passivation film 1129*c* may include an inorganic insulating film and/or an organic insulating film. The passivation film 1129*c* may have a complex stacked structure of an inorganic insulating film and an organic insulating film.

The OLED may be disposed on the passivation film 1129*c*.

The OLED layer 1130 may include a pixel electrode 1131 formed on the passivation film 1129*c*, a counter electrode 1135 facing the pixel electrode 1131, and an intermediate layer 1133 disposed between the pixel electrode 1131 and the counter electrode 1135.

In a bottom-emission type organic light-emitting display apparatus, the pixel electrode 1131 is a transmissive electrode and the counter electrode 1135 is a reflective electrode. In a top-emission type organic light-emitting display apparatus, the pixel electrode 1131 is a reflective electrode and the counter electrode 1135 is a transmissive electrode. Hereinafter, the top-emission type organic light-emitting display apparatus, wherein the OLED emits light towards the thin-film encapsulation layer 1180, will be described.

The pixel electrode 1131 may be a reflective electrode. The pixel electrode 1131 may have a stacked structure of a reflective layer and a transparent or translucent electrode layer having a high work function. The pixel electrode 1131 may operate as an anode.

A pixel-defining film 1140 that covers an edge of the pixel electrode 1131, exposes a center of the pixel electrode 1131, and has a predetermined opening may be disposed on the pixel electrode 1131. The intermediate layer 1133 including an organic light-emitting layer may be disposed on a region limited by the opening.

The counter electrode 1135 may be a transmissive electrode. The counter electrode 1135 may be a semi-transmissive film wherein a metal having a low work function is thinly formed. In order to compensate for high resistance of a thin metal semi-transmissive film, a transparent conductive film formed of a transparent conductive oxide may be stacked on a metal semi-transmissive film. The counter electrode 1135 may be formed throughout the substrate 1110, as a common electrode, and may operate as a cathode. Alternatively, polarities of the pixel electrode 1131 and the counter electrode 1135 may be switched around.

The intermediate layer 1133 may include an organic light-emitting layer that is formed of a low molecular organic material or a high molecular organic material. When the organic light-emitting layer is a low molecular organic layer formed of a low molecular organic material, a hole transport layer (HTL) and a hole injection layer (HIL) may be disposed in a direction of the pixel electrode 1131, and an electron transport layer (ETL) and an electron injection layer (EIL) may be disposed in a direction of the counter electrode 1135 based on the organic light-emitting layer. On the other hand, when the organic light-emitting layer is a high molecular organic layer formed of a high molecular organic material, a HTL may be disposed in the direction of the pixel electrode 1131 based on the organic light-emitting layer.

In FIG. 12, the OLED layer 1130 is disposed on the device/wire layer 1120 where the driving TFT is disposed, but alternatively, the pixel electrode 1131 of the OLED may be formed on a same layer as the active layer 1121 of the TFT, the pixel electrode 1131 may be disposed on a same layer as the gate electrode 1123 of the TFT, or the pixel electrode 1131 may be disposed on a same layer as the source and drain electrodes 1125*a* and 1125*b*.

Also, in FIG. 12, the gate electrode 1123 of the driving TFT is disposed on the active layer 1121, but alternatively, the gate electrode 1123 may be disposed below the active layer 1121.

The thin-film encapsulation layer 1180 may be disposed on the substrate 1110 to cover the device layer 1100. The OLED included in the device layer 1100 may be formed of an organic material, and thus may be easily deteriorated by external moisture or oxygen. Accordingly, the device layer 1100 is encapsulated to protect the device layer 1100, and the thin-film encapsulation layer 1180 may have a stacked structure, wherein a plurality of organic materials and a plurality of inorganic materials are alternately stacked on each other, so as to encapsulate the device layer 1100.

The thin-film encapsulation layer 1180 may include the lower inorganic film 1150, the organic film 1160, and the upper inorganic film 1170, which are sequentially stacked. Alternatively, the thin-film encapsulation layer 1180 may have a structure, wherein at least three inorganic films and at least two organic films are alternately stacked. A lowermost or uppermost layer of the thin-film encapsulation layer 1180 may be an organic film.

The lower inorganic film 1150 and the upper inorganic film 1170 may be formed of an aluminum oxide, a silicon oxide, or a silicon nitride. The lower and upper inorganic films 1150 and 1170 may have a stacked structure of a plurality of inorganic insulating layers. The lower and upper inorganic films 1150 and 1170 may suppress external moisture and/or oxygen from penetrating into the OLED layer 1130.

The organic film 1160 may be formed of a polymer organic compound. The organic film 1160 may relieve an internal stress of the lower and upper inorganic films 1150 and 1170, or compensate for defects of and flatten the lower and upper inorganic films 1150 and 1170.

According to the display apparatus of the present invention, by forming an inorganic film of a thin-film encapsulation layer on a bendable region to have a constant pattern, a stress due to bending may be relieved. Accordingly, the inorganic film of the thin-film encapsulation layer may be prevented from cracking, and a lifespan of the display apparatus may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
   a substrate comprising a display region that comprises a plurality of light-emitting devices, and an edge region that surrounds the display region; and
   a thin-film encapsulation layer disposed on the display region and the edge region of the substrate, wherein the thin-film encapsulation layer comprises a plurality of inorganic films and at least one organic film disposed between the plurality of inorganic films, at least one of the plurality of the inorganic films including inorganic patterns that are spatially separated from each other.

2. The display apparatus of claim 1, wherein a portion of the display apparatus, on which the inorganic patterns are disposed, is bendable.

3. The display apparatus of claim 1, wherein the inorganic patterns are located on the edge region.

4. The display apparatus of claim 1, wherein the substrate extends in first and second directions that are perpendicular to each other, the inorganic patterns comprising:
   first inorganic patterns, the display region being disposed between the first inorganic patterns in the first direction; and
   second inorganic patterns, the display region being disposed between the second inorganic patterns in the second direction, the first inorganic patterns being arranged in line patterns extending in the second direction and spatially separated from each other in the first direction, the second inorganic patterns being arranged in line patterns extending in the first direction and spatially separated from each other in the second direction.

5. The display apparatus of claim 1, wherein the inorganic patterns are arranged in tile patterns.

6. The display apparatus of claim 1, wherein the plurality of light-emitting devices are organic light-emitting devices.

7. The display apparatus of claim 1, wherein the inorganic patterns are partially formed on portions of the edge region, and the display region is disposed between the portions of the edge regions.

8. The display apparatus of claim 7, wherein the inorganic patterns are arranged in line patterns extending in a first direction and spatially separated from each other in a second direction perpendicular to the first direction, and the display region is disposed between the portions of the edge regions in the second direction.

9. The display apparatus of claim 1, further comprising an organic material filling a space formed between the inorganic patterns spatially separated from each other.

10. The display apparatus of claim 9, wherein the organic material is the same as a material of the at least one organic film.

11. The display apparatus of claim 9, wherein the organic material is different from a material of the at least one organic film.

12. A display apparatus comprising:
   a substrate comprising a display region and an edge region;
   a plurality of light-emitting devices formed on the display region of the substrate;
   a lower inorganic film disposed on the display region and the edge region to cover the plurality of light-emitting devices;
   an organic film disposed on the lower inorganic film to cover the display region; and
   an upper inorganic film disposed on the lower inorganic film and the organic film to cover the organic film, wherein at least one of the lower inorganic film and the upper inorganic film comprises inorganic patterns formed on the edge region, the inorganic patterns spatially separated from each other.

13. The display apparatus of claim 12, wherein the lower inorganic film comprises the inorganic patterns spatially separated from each other, a portion of the edge region is exposed through a gap formed between the inorganic patterns of the lower inorganic film, and the organic film fills the gap formed between the inorganic patterns of the lower inorganic film, the organic film covering the exposed portion of the edge region.

14. The display apparatus of claim 12, wherein the lower inorganic film comprises the inorganic patterns spatially separated from each other, a portion of the edge region being exposed through a gap formed between the inorganic patterns of the lower inorganic film,
   the display apparatus further comprises an organic material filling the gap formed between the inorganic patterns of the lower inorganic film, the organic material covering the exposed portion of the edge region, and
   the upper inorganic film completely covers the inorganic patterns and the organic material.

15. The display apparatus of claim 12, wherein the edge region is bendable.

16. The display apparatus of claim 12, wherein a portion of the edge region is exposed through a gap formed between the inorganic patterns, and the inorganic patterns comprise lower inorganic patterns and upper inorganic patterns formed on the lower inorganic patterns, the lower inorganic film comprising the lower inorganic patterns, the upper inorganic film comprising the upper inorganic patterns.

17. The display apparatus of claim 16, further comprising an organic material filling the gap formed between the inorganic patterns and covering the exposed portion of the edge region.

18. The display apparatus of claim 12, wherein the lower inorganic film continuously covers the edge region, and the upper inorganic film comprises the inorganic patterns spatially separated from each other, a portion of the lower inorganic film being exposed through a gap formed between the inorganic patterns of the upper inorganic film.

19. The display apparatus of claim 18, further comprising an organic material filling the gap formed between the inorganic patterns of the upper inorganic film, and covering the exposed portion of the lower inorganic film.

* * * * *